US 9,081,607 B2

(12) United States Patent
Blainey et al.

(10) Patent No.: US 9,081,607 B2
(45) Date of Patent: Jul. 14, 2015

(54) CONDITIONAL TRANSACTION ABORT AND PRECISE ABORT HANDLING

(71) Applicant: International Business Machines Corporation, Armonk, NY (US)

(72) Inventors: Robert J Blainey, Ontario (CA); Harold W Cain, III, Katonah, NY (US); Bradly G Frey, Austin, TX (US); Hung Q Le, Austin, TX (US); Cathy May, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 248 days.

(21) Appl. No.: 13/659,800

(22) Filed: Oct. 24, 2012

(65) Prior Publication Data

US 2014/0115590 A1    Apr. 24, 2014

(51) Int. Cl.
| | | |
|---|---|---|
| *G06F 9/46* | (2006.01) | |
| *G06F 13/42* | (2006.01) | |
| *G06F 13/16* | (2006.01) | |
| *G06F 12/04* | (2006.01) | |
| *G11C 7/22* | (2006.01) | |
| *G06F 12/02* | (2006.01) | |

(52) U.S. Cl.
CPC ............ *G06F 9/467* (2013.01); *G06F 12/0292* (2013.01); *G06F 12/04* (2013.01); *G06F 13/1689* (2013.01); *G06F 13/4243* (2013.01); *G11C 7/22* (2013.01)

(58) Field of Classification Search
CPC ............ G06F 11/1451; G06F 11/2064; G06F 11/2082; G06F 12/12; G06F 12/08; G06F 12/122; G06F 12/02; G06F 12/10; G06F 12/0238; G06F 17/30215; G06F 17/30578; G06F 2201/84
See application file for complete search history.

(56) References Cited

U.S. PATENT DOCUMENTS

| | | | |
|---|---|---|---|
| 8,229,907 | B2 | 7/2012 | Gray et al. |
| 2008/0040551 | A1* | 2/2008 | Gray et al. ................ 711/130 |
| 2010/0023704 | A1 | 1/2010 | Christie et al. |
| 2010/0023707 | A1 | 1/2010 | Hohmuth et al. |
| 2011/0209151 | A1 | 8/2011 | Chung et al. |
| 2011/0296148 | A1 | 12/2011 | Cain, III et al. |
| 2011/0307689 | A1* | 12/2011 | Chung et al. ............... 712/234 |
| 2012/0079246 | A1 | 3/2012 | Breternitz, Jr. et al. |

(Continued)

FOREIGN PATENT DOCUMENTS

WO    2012040715    3/2012

OTHER PUBLICATIONS

William N. Scherer III et al., Contention Management in Dynamic Software Transactional Memory, Apr. 2004, 10 pages.

(Continued)

*Primary Examiner* — Jared Rutz
*Assistant Examiner* — Jean Edouard
(74) *Attorney, Agent, or Firm* — Yudell Isidore PLLC; Parashos Kalaitzis (57) ABSTRACT

A method for executing a transaction in a data processing system initiates the transaction by a transactional-memory system coupled to that memory component. The method includes initiating the transaction by a transactional-memory system that is part of a memory component of the data processing system. The transaction includes instructions for comparing multiple parameters, and aborting the transaction by the transactional-memory system based upon a comparison of the multiple parameters.

20 Claims, 4 Drawing Sheets

(56) References Cited

U.S. PATENT DOCUMENTS

2012/0124563 A1* 5/2012 Chung et al. .................. 717/140
2012/0131312 A1* 5/2012 Seal et al. ..................... 712/208
2012/0179877 A1* 7/2012 Shriraman et al. ............ 711/141

OTHER PUBLICATIONS

Arrvindh Shriraman et al., Hardware Acceleration of Software Transactional Memory, May 18, 2006, 10 pages.

* cited by examiner

CONDITIONAL TRANSACTION ABORT AND PRECISE ABORT HANDLING

FIELD OF THE INVENTION

The present disclosure relates generally to transactional memory systems. More particularly, the present disclosure relates to aborting transactions in transactional memory systems.

BACKGROUND

A transaction is a set of operations that transforms the data from one state to another. A transaction typically includes a section of program code or a set of program instructions. In a transactional memory system, the concurrent transactions are speculatively executed and only those transactions are committed that are non-conflicting. A conflict may occur when two or more concurrent transactions access similar pieces of data, such as word, block, object, etc. from a memory, and at least one memory access is a write access. Transactions may be unable to succeed for a number of other reasons. For example, the transactional storage accesses may exceed the capacity of the conflict detection mechanism or an instruction that is illegal in a transaction may be found in the transaction. In the following description, these additional reasons are understood to be included in descriptions of behavior generally related to conflicts, although they are a distinct set of reasons that transactions do not succeed. Transactional memory systems may abort some transactions in order to resolve conflicts among concurrent transactions. One common challenge in the design of transactional memory systems is the asynchronous occurrence of some transaction abort conditions relative to the execution of the transaction itself. This can present difficulties for programmers coding the transactions and later trying to understand why a transaction did not succeed, for example if multiple transaction abort conditions occur, or when a transaction abort condition occurs due to an instruction that was executed much earlier in the transaction, or due to an instruction that has been executed but not committed at the time that failure handling occurs. It could also present difficulties for designers, if all asynchronous conflicts were required to be manifest before any subsequent instructions were executed.

The changes made by a transaction to a memory are validated, and if validation is successful, the changes are made permanent, and the transaction is referred to as a committed transaction. If a transaction cannot be committed due to conflicts, it is aborted, and any changes made by the execution of the instructions in the transaction are rolled-back. The aborted transaction is re-executed from the beginning until it succeeds.

The transactional memory system can be implemented in the form of hardware or software, or a combination of both. Hardware transactional memory systems include modifications to the processors, caches, and bus protocols to support transactions. Software transactional memory system provides transactional memory semantics in a software runtime library.

In software that includes speculative transformations, often the code includes one or more transactional abort instructions, the execution of which is based on the result of a condition specified in a previous instruction. For example, in one exemplary speculative optimization on a program that does numerical calculations, code may be optimistically generated to perform operations using low-latency fixed point instructions, on the prediction that no divisions will be performed that generate a remainder. In the event that a division does produce a remainder, the transaction may be aborted based on the presence of a remainder, and a floating point version of the code may be executed.

In another example, an array bounds check may be performed, in which it is detected whether a variable is within some bounds/limits. It is particularly relevant to a variable used as an index into an array to ensure its values lies within bounds of the array. The transaction may be aborted in a current instruction based on comparison of the variable with upper/lower limits in a previous instruction. However, performing bound checking may be quite time consuming, especially when there is a large number of variables on which bound checking needs to be performed.

The fixed point arithmetic and array bound checking are just examples, which include a transaction abort instruction based on a previous instruction. There could be many other transactions which include a transaction abort instruction based on a previous instruction. Thus, a code which includes a large number of transaction abort instructions is quite large in size as the transaction abort instruction is always present in a code along with other instruction. Hence, there is a need for a solution which reduces the size of the code which contains transaction abort instructions. There is also a need for ease of coding, more efficient cache/storage use to increase performance.

In light of the foregoing discussion, there exists a need to provide a solution that overcomes the above mentioned problems associated with the prior art alternatives.

BRIEF SUMMARY

Various embodiments of the present disclosure provide a method for executing a transaction in a data processing system. The data processing system includes a memory and a transactional memory system coupled to the memory. The method includes initiating the transaction by the transactional memory system. The transaction comprises instructions for comparing a number of parameters. The method further includes aborting the transaction by the transactional memory system based on comparison of these parameters with each other. The multiple parameters include signed and unsigned parameters. The comparison instructions are given an attribute called "failure synchronization", which is also given to certain other operations, and which causes any latent asynchronous conflicts to be manifest. The transaction will be aborted immediately based on the manifestation of the latent conflicts.

In one embodiment of the invention, the transaction is aborted when the plurality of parameters satisfy at least one comparison condition of a set of pre-defined comparison conditions. In another embodiment of the present invention, the transaction is aborted when the plurality of parameters satisfy each comparison condition of the set of pre-defined comparison conditions. The set of pre-defined comparison conditions comprises greater than condition, less than condition, equal to condition, not equal to condition, not greater than condition, and not less than condition.

Various embodiments of the present invention provide a method for executing a transaction in a data processing system. The data processing system comprises a memory and a transactional memory system coupled to the memory. The method comprises initiating the transaction by the transactional memory system; detecting transaction failure due to a plurality of abort-causing conditions; and precisely recording the cause of transaction failure in a diagnostic register.

Various embodiments of the present disclosure provide a data processing system for executing a transaction. The data processing system comprises a memory and a transactional memory system coupled to the memory. The transactional memory system is configured to initiate the transaction, wherein the transaction includes instructions for comparing a plurality of parameters. The transactional memory system is further configured to abort the transaction based on comparison of the plurality of parameters.

An alternate embodiment of the present disclosure provides a computer program product embodied on a computer readable medium and comprising a program code for executing an instruction in a data processing system. The data processing system comprises a memory, and a transactional memory system coupled to the memory. The program code comprises instructions for initiating a transaction by the transactional memory system, wherein the transaction comprises instructions for comparing a plurality of parameters, and aborting the transaction by the transactional memory system based on comparison of the plurality of parameters.

BRIEF DESCRIPTION OF SEVERAL VIEWS OF THE DRAWINGS

The features of the present disclosure, which are believed to be novel, are set forth with particularity in the appended claims. Embodiments of the present disclosure will hereinafter be described in conjunction with the appended drawings provided to illustrate and not to limit the scope of the claims, wherein like designations denote like elements. Having thus described the invention in general terms, reference will now be made to the accompanying drawings, which are not necessarily drawn to scale, and wherein:

DETAILED DESCRIPTION

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF cable, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 1:
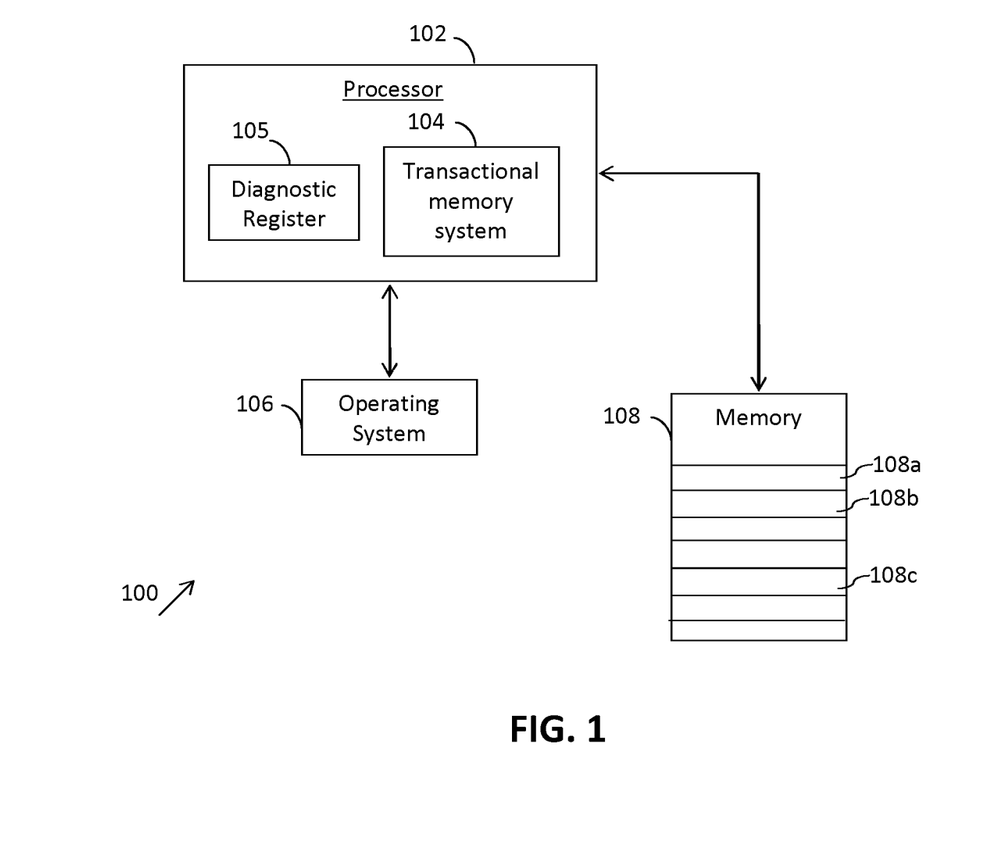
FIG. 1 illustrates a data processing system for executing a transaction, in accordance with an embodiment of the present disclosure.

With reference now to the figures and in particular with reference to FIG. 1, an exemplary diagram of a data processing system is provided in which illustrative embodiments may be implemented. It should be appreciated that FIG. 1 is only exemplary and is not intended to assert or imply any limitation with regard to the environments in which different embodiments may be implemented. Many modifications to the depicted environments may be made.

FIG. 1 is a block diagram illustrating a data processing system 100, in accordance with various embodiments of the present disclosure. The data processing system 100 may be a computing device in which computer usable code or instructions may be stored and executed for performing one or more logical and arithmetic operations. Examples of the data processing system 100 include, but are not limited to, computer, tablet, laptop, and PDA.

The data processing system 100 includes a processor 102 and a memory 108. Though not shown, but a person skilled in the art will appreciate that the processor 102 may in turn include one or more processors. The memory 108 may include a main memory, a hard disk drive, a read only memory (ROM), a cache memory, etc. Further, the memory 108 includes different addresses 108a, 108b and 108c for storing data.

The data processing system 100 further includes an operating system 106, which runs on the processor 102. The operating system 106 may manage various components and processes within the data processing system 100. The operating system 106 may be a commercially available operating system such as, but not limited to, Windows 7, Windows XP, Lion, Linux, and so forth.

The processor 102 includes a transactional memory system 104. In one embodiment, the transactional memory system 104 may be implemented as a hardware transactional memory system. In another embodiment, the transactional memory system 104 may be implemented as a software transactional memory system. In yet another embodiment, the transactional memory system 104 may be implemented as a combination of hardware and software.

In an embodiment of the present disclosure, the transactional memory system 104 may be configured to execute a transaction, which comprises instructions for comparing a number of parameters. Examples of parameters, include, but are not limited to, a word, an alphabet, a numeral, an image, and so forth. For example, the transaction may include instructions for comparing two words, referred to as a single word comparison. The transaction may further include instructions for comparing a set of two words with another set of two words, referred to as double word comparison.

The transactional memory system 104 is configured to initiate the transaction and abort the transaction based on an outcome of comparison of the parameters. The transaction will be aborted in a failure-synchronizing manner, such that latent conflicts are manifest as an additional function of the execution of the compare instruction. The parameters may be signed and unsigned parameters. The abort condition of the transaction can be a logical "OR" of number of pre-defined comparison conditions of the parameters, which means that the transaction would be aborted when at least one pre-defined comparison condition is satisfied by the parameters. Examples of pre-defined comparison conditions between parameters include, but are not limited to, greater than, less than, equal to, not equal to, not greater than, not less than, less than or equal to, signed greater than, signed less than, equal to, unsigned greater than, and unsigned less than. It may be noted that multiple combinations of pre-defined comparison conditions are possible to define an abort condition for the transaction.

The processor 102 further includes a transactional diagnostic register 105 for precisely recording the cause of transaction failure due to a plurality of abort-causing conditions. On detection of a transaction abort condition, due to a to-be-defined conditional tabort instruction, or due to some other abort-causing instruction, the instruction is marked as causing transactional abort, and abort handling and recording of the abort cause in the transactional diagnostic register 105 is delayed until the processor core commits the abort causing instruction similar to the handling of interrupts and exceptions by the processor 102. However, in the case of a disallowed instruction, which is mentioned in paragraph 2, above, the instruction is not committed, like interrupts and exceptions, which may be handled precisely and thereby preserve, to the programmer, a sequential programming model, the delaying of abort handling, and the recording of the abort cause in a diagnostic register 105 until the processor's commit stage ensures that a transaction abort will also appear to occur precisely to programmers. That is, the various transaction diagnostic registers 105 will precisely indicate the cause of the transaction abort.

In an exemplary scenario, an abort condition of the transaction may be a logical "OR" of five pre-defined comparison conditions of first and second parameters, such as signed less than, signed greater than, unsigned less than, unsigned greater than and equal to. That example is only illustrative, and should not be construed as limiting the scope of the present disclosure, as other abort conditions are also possible from the above-mentioned pre-defined comparison conditions.

Figure 2:
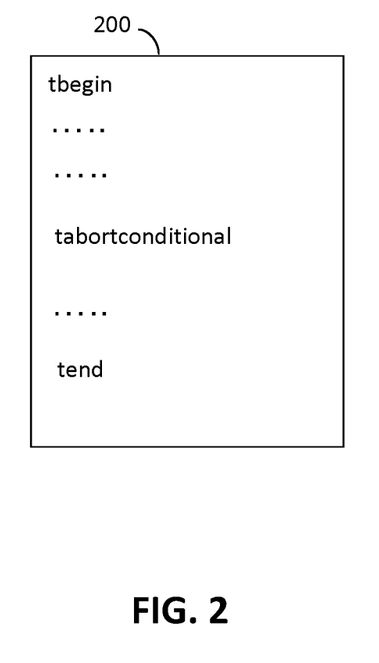
FIG. 2 illustrates a portion of code to be executed as a transaction with a transactional memory system, in accordance with an embodiment of the present disclosure.

FIG. 2 illustrates a portion of code 200 to be executed as a transaction with a transactional memory system 104, in accordance with an embodiment of the present disclosure. The transaction is initiated using a transaction begin instruction "tbegin" The transaction may be aborted using a transaction instruction "tabortconditional". The "tabortconditional" may comprise instructions for aborting the transaction based on the outcome of comparison of two parameters such as "a" and "b". The comparison condition(s) for aborting the transaction may already be defined by a user. When parameters a and b satisfy at least one pre-defined comparison condition, the transaction is aborted. The transaction is ended using a transaction end instruction "tend". It may be noted that "tabortconditional" instruction includes both comparison and abortion instructions in a single instruction, thus reducing the number of instructions in the code 200.

In an exemplary embodiment, the transaction may comprise instructions for comparing two words 'a' and 'b' referred to as single word comparison. Examples of aborting of the transaction on single word comparison, may include, but are not limited to:

tabortwc. TO, RA, RB (Transaction Abort Word Conditional)

tabortwci. TO, RA, SI (Transaction Abort Word Conditional Immediate)

In another exemplary embodiment, the transaction may comprise instructions for comparing double words 'a' and 'b', referred to as double word comparison. Example of aborting of transaction on double word comparison may include, but are not limited to:
tabortdc. TO, RA, RB (Transaction Abort Doubleword Conditional)
tabortdci. TO, RA, SI (Transaction Abort Doubleword Conditional Immediate)

In another exemplary embodiment, the instruction "tabortconditional" may comprise instructions such as
If a<b && T0[0] then abort
If a>b && T0[1] then abort
If a==b && TO[2] then abort
The TO bits can be used to differentiate between signed and unsigned comparison of the plurality of parameters.

Figure 3:
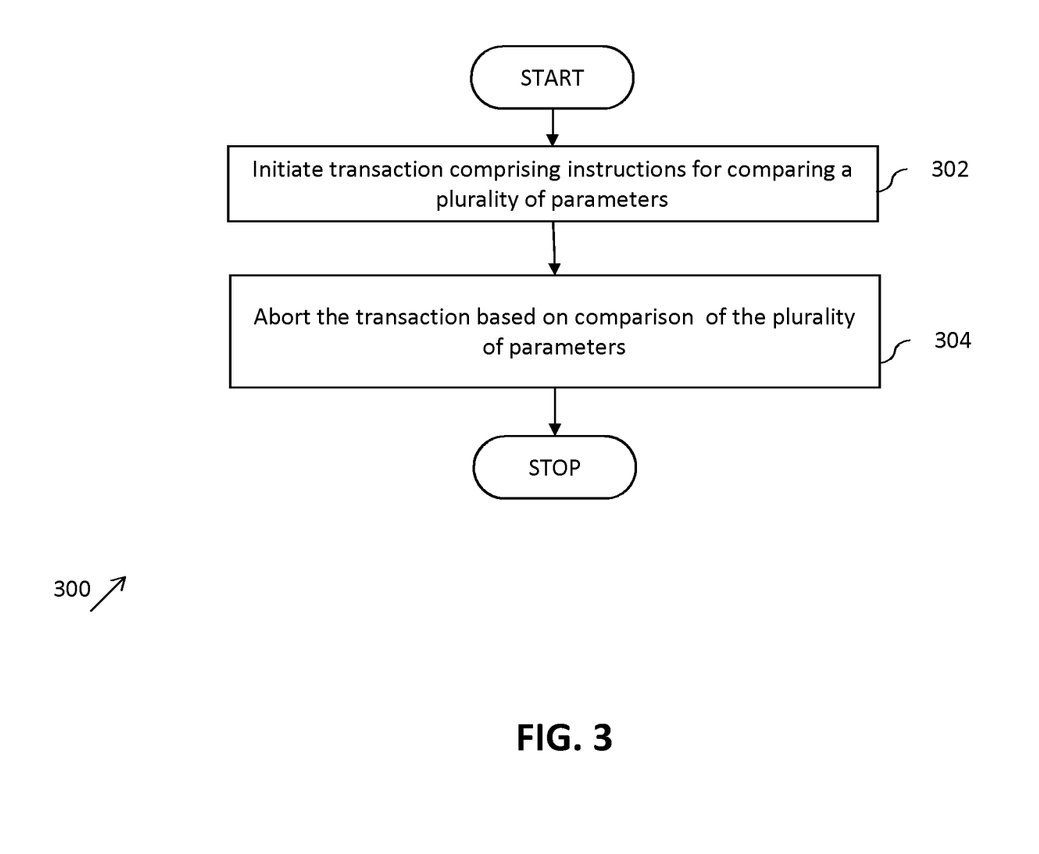
FIG. 3 is a flowchart illustrating a method for executing the transaction, in accordance with an embodiment of the present disclosure.

FIG. 3 is a flowchart illustrating a method 300 for executing a transaction in accordance with an embodiment of the present disclosure. In an embodiment of the present disclosure, the method of executing the transaction is performed by the transactional memory system 104.

At step 302, the transaction is initiated. The transaction may include instructions for comparing a number of parameters as discussed with reference to FIGS. 1-2. Then at step 304, the transaction is aborted based on the comparison of these parameters. The abort condition for the transaction can be a logical "OR" of outcomes of a number of pre-defined comparison conditions of the parameters, which means that the transaction may be aborted when at least one pre-defined comparison condition is satisfied by the parameters. Examples of pre-defined comparison conditions among parameters include, but are not limited to, greater than, less than, equal to, not equal to, not greater than, not less than, less than or equal to, signed greater than, signed less than, equal to, unsigned greater than, and unsigned less than. It may be noted that the comparison of parameters and the abortion of the transaction is taking place in a single step 304, instead of in two or more separate steps, thus reducing the number of instructions for executing the transaction.

The transaction instruction "tabortconditional" described in the foregoing FIG. 2 is useful in systems that perform speculative optimization. Examples of systems that perform speculative optimization include, but are not limited to, static compilers, binary translation systems, post-link optimizers, managed runtime systems and virtual machines, and hand-coded speculative optimizations at the source or assembly level.

An example of a speculative optimization is a program that does numerical calculations, where code may be optimistically generated to perform operations using low-latency fixed point instructions, on the prediction that no divisions will be performed that generate a remainder. In the event that a division does produce a remainder, the transaction may be aborted based on the presence of a remainder, and a floating point version of the code may be executed.

An example of an optimization in which the instruction "tabortconditional" is particularly useful is elimination of array bounds checks from code. In computer systems, bound checking is a method of detecting whether a variable is within some bounds/limits before use.

For example, in some computer programming languages, references to entries in an array always need to be accompanied by checks that the index into the array is within bounds, i.e. that the index used to reference the array is greater than or equal to 0, and that it is less than the total number of elements in the array.

A code might be written in programming language Java that does
x[y]=0
where x is an array of 1000 elements and the address of the array, x is in r3 and y is in r4. During compilation, it will be checked that r4 has a value ranging from 0 to 999, as x is an array of 1000 elements. When the value of r4 is less than zero or greater than 999, an error would be generated or the transaction would be aborted.

Without using tabortconditional instruction, and assuming that x is a byte array, a compiler would compile the code x[y]=0 to the following code

```
cmpi r4, 0
blt error_handler
cmpi r4, 999
bgt error_handler
li r5, 0
st r5, r3, r4
```

In the first four instructions, r4 is compared with zero, an error is generated when r4 is less than zero, and then r4 is compared with 999 and an error is generated when r4 is greater than 999.

In a system that uses speculative optimization, the code x[y]=0 would be compiled to the following code:

```
tabortdci LT, r4, 0      (abort the transaction if r4 is less than zero)
tabortdci GT, r4, 999    (abort the transaction if r4 is greater than 999)
li r5, 0
st r5, r3, r4
```

Each cmpi and branch above is replaced by a single conditional tabort instruction. Thus, by using the conditional tbort instruction, the first four instructions of the previous code are replaced by only two instructions. Thus, the number of instructions in the compiled code is reduced from 6 to 4, or 33%, which increases the efficiency and reduces the time in executing the code.

Figure 4:
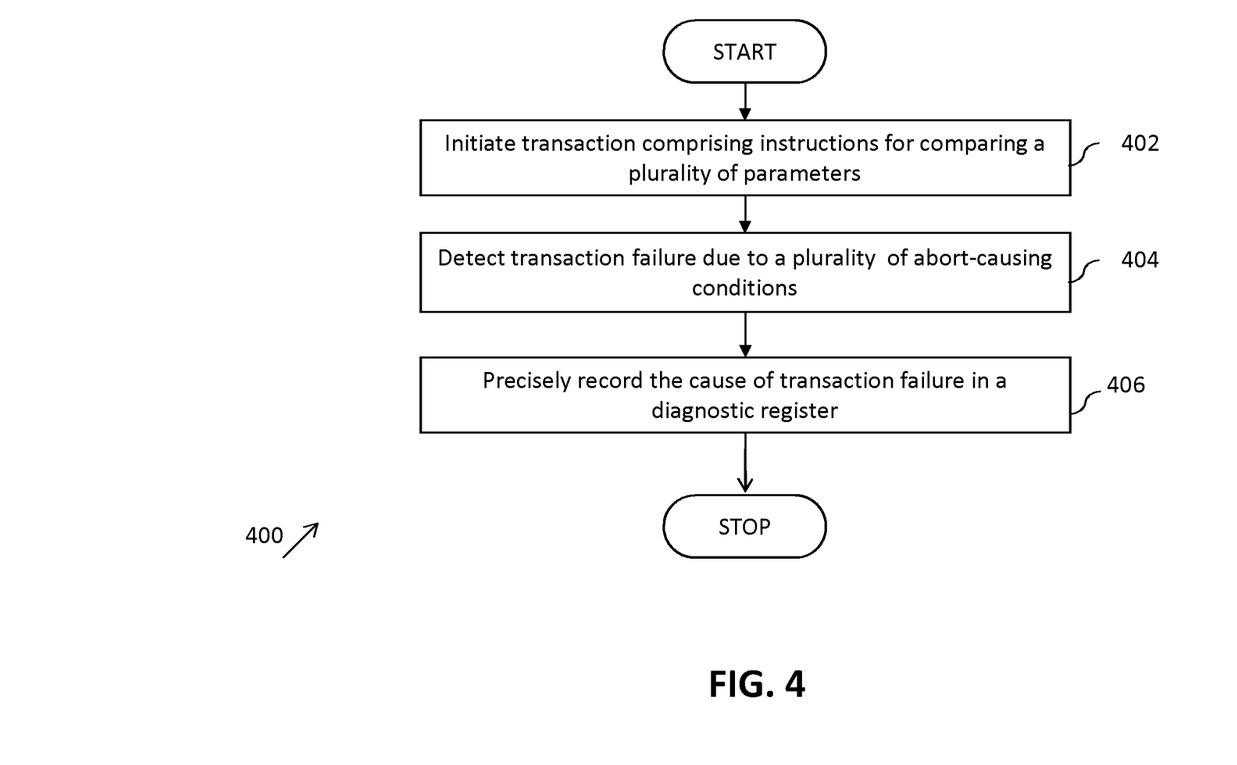
FIG. 4 is a flowchart illustrating another method for executing the transaction, in accordance with another embodiment of the present disclosure.

FIG. 4 is a flowchart illustrating a method 400 for executing a transaction in accordance with another embodiment of the present disclosure. In an embodiment of the present disclosure, the method of executing the transaction is performed by the transactional memory system 104.

At step 402, the transaction is initiated. The transaction may include instructions for comparing a number of parameters as discussed with reference to FIGS. 1-2. Then at step 404, the transactional failure may be detected. The transaction failure may take place due to a plurality of abort-causing conditions as discussed with reference to FIGS. 1-2. Then at step 406, the cause of transaction failure is recorded in a diagnostic register.

Embodiments of the invention are described above with reference to block diagrams and schematic illustrations of methods and systems according to embodiments of the invention. It will be understood that each block of the diagrams and combinations of blocks in the diagrams can be implemented by computer program instructions. These computer program instructions may be loaded onto one or more general-purpose computers, special purpose computers, or other programmable data processing translator to produce machines, such that the instructions, which execute on the computers or other programmable data processing translator create means for implementing the functions specified in the block or blocks. Such computer program instructions may also be stored in a computer-readable memory that can direct a computer or other programmable data processing apparatus to function in a particular manner, such that the instructions stored in the computer-readable memory produce an article of manufacture including instruction means that implement the function specified in the block or blocks.

While the invention has been described in connection with what is presently considered to be the most practical and various embodiments, it is to be understood that the invention is not to be limited to the disclosed embodiments, but on the contrary, is intended to cover various modifications and equivalent arrangements included within the spirit and scope of the appended claims. The invention has been described in the general context of computing devices, phone and computer-executable instructions, such as program modules, being executed by a computer. Generally, program modules include routines, programs, characters, components, data structures, etc., that perform particular tasks or implement particular abstract data types. A person skilled in the art will appreciate that the invention may be practiced with other computer system configurations, including hand-held devices, multiprocessor systems, microprocessor-based or programmable consumer electronics, network PCs, minicomputers, mainframe computers, and the like. Further, the invention may also be practiced in distributed computing worlds where tasks are performed by remote processing devices that are linked through a communications network. In a distributed computing world, program modules may be located in both local and remote memory storage devices.

This written description uses examples to disclose the invention, including the best mode, and also to enable any person skilled in the art to practice the invention, including making and using any devices or systems and performing any incorporated methods. The patentable scope of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements as specifically claimed. The description of the various embodiments of the present invention has been presented for purposes of illustration, but is not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for executing a transaction in a data processing system, the data processing system comprising a memory and a transactional memory system coupled to the memory, the method comprising:
    initiating the transaction by the transactional memory system, wherein the transaction comprises instructions for comparing a plurality of parameters via a tabortconditional instruction;
    in response to initiating the transaction, executing the tabortconditional instruction, wherein the tabortconditional instruction comprises, within a single instruction, instructions for performing a comparison of the plurality of parameters and instructions for aborting the transaction, wherein the instructions for aborting the transaction define one or more logical OR operations that when satisfied result in an abort condition;
    in response to the comparison of the plurality of parameters satisfying a pre-defined comparison condition, the transactional memory system aborting the transaction via the tabortconditional instruction, wherein the aborting of the transaction results in a transaction failure; and
    precisely recording the cause of transaction failure in a diagnostic register.

2. The method as claimed in claim 1, wherein the transaction comprises instructions for comparing a plurality of words.

3. The method as claimed in claim 1, wherein the plurality of parameters comprises one or more signed parameters and one or more unsigned parameters.

4. The method as claimed in claim 1, wherein the pre-defined comparison condition further comprises at least one combination of one or more pre-defined comparison conditions of a plurality of pre-defined comparison conditions, and wherein the transaction is immediately aborted in response to manifestation of any latent conflicts in the transaction.

5. The method as claimed in claim 4 further comprising aborting the transaction when the plurality of parameters satisfy each comparison condition of the plurality of pre-defined comparison conditions.

6. The method as claimed in claim 5, wherein the plurality of pre-defined comparison conditions comprises: a greater than condition, a less than condition, an equal to condition, a not equal to condition, a not greater than condition, and a not less than condition.

7. The method as claimed in claim 5 further comprising aborting the transaction when the plurality of parameters satisfy at least one of: a signed less than condition, a signed greater than condition, an unsigned less than condition, an unsigned greater than condition, and an equal to condition.

8. The method as claimed in claim 1, wherein the transaction is executed in a system that performs speculative optimization.

9. A data processing system for executing a transaction, the data processing system comprising a memory and a transactional memory system coupled to the memory, wherein the transactional memory system is configured to:
    initiate the transaction, wherein the transaction comprises instructions for comparing a plurality of parameters via a tabortconditional instruction;
    in response to initiating the transaction, execute the tabortconditional instruction, wherein the tabortconditional instruction comprises, within a single instruction, instructions for performing a comparison of the plurality of parameters and instructions for aborting the transaction, wherein the instructions for aborting the transaction define one or more logical OR operations that when satisfied result in an abort condition;

in response to the comparison of the plurality of parameters satisfying a pre-defined comparison condition, abort the transaction via the tabortconditional instruction, wherein the aborting of the transaction results in a transaction failure; and precisely record the cause of transaction failure in a diagnostic register.

10. The data processing system as claimed in claim 9, wherein the transactional memory system is a hardware transactional memory system.

11. The data processing system as claimed in claim 9, wherein the transactional memory system is a software transactional memory system.

12. The data processing system as claimed in claim 9, wherein:

the transaction comprises instructions for comparing a plurality of words;

the plurality of parameters comprises one or more signed parameters and one or more unsigned parameters;

the pre-defined comparison condition further comprises at least one combination of one or more pre-defined comparison conditions of a plurality of pre-defined comparison conditions; and the transaction is immediately aborted in response to manifestation of any latent conflicts in the transaction.

13. The data processing system as claimed in claim 9 further comprising a speculative optimizer.

14. A computer program product embodied on a computer readable medium and comprising a program code for executing an instruction in a data processing system, the data processing system comprises a memory, and a transactional memory system coupled to the memory, the program code comprising instructions for:

initiating a transaction by the transactional memory system, wherein the transaction comprises instructions for comparing a plurality of parameters via a tabortconditional instruction;

in response to initiating the transaction, executing the tabortconditional instruction, wherein the tabortconditional instruction comprises, within a single instruction, instructions for performing a comparison of the plurality of parameters and instructions for aborting the transaction, wherein the instructions for aborting the transaction define one or more logical OR operations that when satisfied result in an abort condition;

in response to the comparison of the plurality of parameters satisfying a pre-defined comparison condition, the transactional memory system aborting the transaction via the tabortconditional instruction, wherein the aborting of the transaction results in a transaction failure; and precisely recording the cause of transaction failure in a diagnostic register.

15. The computer program product as claimed in claim 14, wherein the transaction comprises instructions for comparing a plurality of words.

16. The computer program product as claimed in claim 14, wherein the plurality of parameters comprises one or more signed parameters and one or more unsigned parameters.

17. The computer program product as claimed in claim 14, wherein the pre-defined comparison condition further comprises at least one combination of one or more pre-defined comparison conditions of a plurality of pre-defined comparison conditions, and wherein the transaction is immediately aborted in response to manifestation of any latent conflicts in the transaction.

18. The computer program product as claimed in claim 17, further comprising instructions for aborting the transaction when the plurality of parameters satisfy each comparison condition of the plurality of pre-defined comparison conditions.

19. The computer program product as claimed in claim 17, wherein the plurality of pre-defined comparison conditions comprises: a greater than condition, a less than condition, an equal to condition, a not equal to condition, a not greater than condition, and a not less than condition.

20. The computer program product as claimed in claim 19, further comprising instructions for aborting the transaction, when the plurality of parameters satisfy at least one of a signed less than condition, a signed greater than condition, an unsigned less than condition, an unsigned greater than condition, and an equal to condition.

* * * * *